(12) United States Patent
Coats et al.

(10) Patent No.: US 7,211,368 B2
(45) Date of Patent: May 1, 2007

(54) STEREOLITHOGRAPHY RESINS AND METHODS

(75) Inventors: Alma L. Coats, Delray Beach, FL (US); James P. Harrison, Pembroke Pines, FL (US); James Scott Hay, Parkland, FL (US); Manuel Jacinto Ramos, Hollywood, FL (US)

(73) Assignee: 3 Birds, Inc., Pompano Beach, FL (US)

( * ) Notice: Subject to any disclaimer, the term of this patent is extended or adjusted under 35 U.S.C. 154(b) by 0 days.

(21) Appl. No.: 10/628,304

(22) Filed: Jul. 29, 2003

(65) Prior Publication Data

US 2004/0135292 A1 Jul. 15, 2004

Related U.S. Application Data

(60) Provisional application No. 60/438,496, filed on Jan. 7, 2003.

(51) Int. Cl.
*G03F 7/038* (2006.01)

(52) U.S. Cl. .................. 430/284.1; 526/261; 526/301; 522/96; 522/8

(58) Field of Classification Search .............. 430/284.1
See application file for complete search history.

(56) References Cited

U.S. PATENT DOCUMENTS

| | | | | |
|---|---|---|---|---|
| 3,954,584 | A * | 5/1976 | Miyata et al. ........... | 430/284.1 |
| 4,006,024 | A * | 2/1977 | Ibata et al. .............. | 430/283.1 |
| 4,863,538 | A | 9/1989 | Deckard | |
| 5,076,974 | A * | 12/1991 | Modrek et al. ............. | 430/269 |
| 5,204,055 | A | 4/1993 | Sachs et al. | |
| 5,418,112 | A * | 5/1995 | Mirle et al. .............. | 430/284.1 |
| 5,470,689 | A | 11/1995 | Wolf et al. | |
| 5,716,603 | A * | 2/1998 | Chen et al. ................... | 424/61 |
| 5,849,459 | A * | 12/1998 | Hagiwara et al. ........ | 430/280.1 |
| 5,880,171 | A * | 3/1999 | Lim et al. .................. | 523/106 |
| 5,881,194 | A * | 3/1999 | Duecker ..................... | 522/90 |
| 5,891,530 | A * | 4/1999 | Wright ....................... | 427/515 |
| 5,919,834 | A * | 7/1999 | Downs et al. ................ | 522/33 |
| 5,968,605 | A * | 10/1999 | Lutz ........................... | 427/500 |
| 6,017,973 | A * | 1/2000 | Tamura et al. ................ | 522/96 |
| 6,080,450 | A * | 6/2000 | Cantor ...................... | 427/517 |
| 6,120,946 | A * | 9/2000 | Johnson et al. ............... | 430/7 |
| 6,326,072 | B1 * | 12/2001 | Ojeda et al. ............... | 428/40.1 |
| 6,406,658 | B1 | 6/2002 | Manners et al. | |
| 6,413,696 | B1 | 7/2002 | Pang et al. | |
| 6,420,451 | B1 * | 7/2002 | Lin et al. ....................... | 522/83 |
| 2002/0086914 | A1 * | 7/2002 | Lee et al. ..................... | 522/75 |
| 2003/0021961 | A1 * | 1/2003 | Ylitalo et al. ................ | 428/195 |
| 2004/0121268 | A1 * | 6/2004 | Conroy et al. ............ | 430/285.1 |

FOREIGN PATENT DOCUMENTS

| | | | |
|---|---|---|---|
| DE | 44 40 819 A1 | | 5/1995 |
| EP | 0 228 854 A2 | * | 7/1987 |
| EP | 0 536 086 A1 | | 4/1993 |
| EP | 0 614 122 A1 | | 9/1994 |
| EP | 0 715 212 A1 | | 6/1996 |
| EP | 0 874012 A1 | * | 4/1998 |
| EP | 0 877 389 A1 | * | 11/1998 |
| EP | 1 065 181 A2 | * | 1/2001 |
| EP | 1 178 064 A1 | * | 2/2002 |
| WO | WO-97/23524 A1 | * | 7/1997 |
| WO | WO 97/42529 A1 | * | 11/1997 |
| WO | WO-98/28307 A1 | * | 7/1998 |
| WO | WO-98/45344 A1 | * | 10/1998 |
| WO | WO 00/20517 A2 | * | 3/2000 |
| WO | WO01/98817 A2 | * | 12/2001 |
| WO | WO-02/39183 A1 | * | 5/2002 |
| WO | WO 02/48202 A1 | * | 6/2002 |

OTHER PUBLICATIONS

Sartomer Application Bulletin, "CN-980 Aliphatic High Speed Urethane Acrylate", two pages, dated May 2002, Olklands Corprate Center, Exton, PA., Sartomer Company from Web Site Of Sartomer.*

RN 41484-35-9, from Registry file entered Nov. 16, 1984, ACS on STN, "Irganox 1035" two pages.*

RN 189146-15-4 from Registry file entered May 20, 1997, from ACS on STN, one page.*

Parakka et al "Binders for Solventless Electron Beam-Cured Mangetic Tape Coating Formulations", Polymeric Materials Scienc and Engineering , vol. 75, Fall Meeting 1996, Orlando Florida, Proceedings of the American Chemical Society, 1996, pp. 297-298.*

Ciba Specialty Chemical, Photoinitioator for UV Curing, Key Products Selection Guide 2003, eight pages, printed in Switzerlan Oct. 2003.*

Glotfelter, "Tg Region Breadth is Critcal to UV-Curable PSA Performance", Adhesives Age: Dec. 1997; 40, 13; ABI/INFORM Global pp. 29-31 PDF version.*

Glotfelter, "Tg Region Breadth is Critcal to UV-Curable PSA Performance", Adhesives Age: Dec. 1997; 40, 13; text version from EBSCO HOst Research Databases, from pp. 29-31, 5 pages. TEXT version.*

Glotfelter, "Tg Region Breadth is Critcal to UV-Curable PSA Performance", Adhesives Age: Dec. 1997; 40, 13; FULL Text+Image version from PROQUEST, 5 pages extracted from pp. 29-31 of article.*

2004 Product Bulletin: Urethane Acrylate Oligomers, Sartomer company, dated Jan. 2004, 28 pages, Exton, Pennsylvania from www.sartomer.com.*

(Continued)

*Primary Examiner*—Cynthia Hamilton
(74) *Attorney, Agent, or Firm*—Steptoe & Johnson LLP

(57) ABSTRACT

Photocurable resin compositions are provided that are most useful in stereolithography. A photocurable resin includes a urethane acrylate oligomer, an acrylate monomer, and a polymerization modifier. The resin after curing provides a solid product that has characteristics that can depend on the resin composition.

30 Claims, No Drawings

OTHER PUBLICATIONS

RN 149260-52-6, Registry file on ACS on STN, entered STN Aug. 12, 1993, one page, reported structure for Esacure KIP 100F.*
RN 174285-64-4, Registry file on ACE on STN, entered Mar. 1996, one page, reported structure for Irgacure 1700.*
U.S. Appl. No. 60/489,945, (No Copy Provided).*
Sartomer product Bulletin: SR-368D dated Oct. 1997, one page, Sartomer Company, Exton, PA.*
Sartomer, Low Toxicity Monomers: What are Their Physical Advantages:, dated Sep. 2001, TOTAL, from www.sartomer.com, 7 pages.*
Handbook of Paint Raw materials (2nd Edition), William Andrew Publishing/Noyes, 1989 p. 734.*
Priplast TM 3192, 2 pages, Technical DataSheet Abstract from Special CHem.coatings & inks, 2006 date.*
"PRIPLASTpolyester polyols derived from dimerized fatty acides" from google result at www.fitzchem.com/pdf/PRIPLAST_intro_8-01.pdf, 31 pages.*
OSHA, Isophorone Diisocyanate (IPDI)- Partially Validated Method #2034, pp. 8, date Apr. 1998, validtaed by David B ARmitage.*
Sartomer Product Bulletin: CN-131, Dec. 1996.
Sartomer Product Bulletin: CN738, No Date.
Sartomer Product Bulletin: CN-963A80, Dec. 1998.
Sartomer Product Bulletin: CN-964, Mar. 1997.
Sartomer Product Bulletin: CN-964E75, Mar. 1997.
Sartomer Product Bulletin: CN-965, Dec. 1998.
Sartomer Product Bulletin: CN-966J75, Apr. 1997.
Sartomer Product Bulletin: CN968, Apr. 2000.
Sartomer Product Bulletin: CN-970H75, Apr. 1997.
Sartomer Product Bulletin: CN-973J75, Apr. 1997.
Sartomer Product Bulletin: CN-990, Mar. 1999.
Sartomer Product Bulletin: CD-540, Oct. 1998.
Sartomer Product Bulletin: SR-368, Nov. 1998.
Sartomer Product Bulletin: SR-506, Dec. 1998.
Sartomer Product Bulletin: SR-306, Nov. 1998.
Sartomer Product Bulletin: SR-454, Nov. 1998.
Sartomer Product Bulletin: SR-494, Nov. 1998.
Sartomer Product Bulletin: CN2400, Jul. 2002.
Sartomer Product Bulletin: SR-256, Nov. 1998.
BYK Chemie, Surface Additives for Radiation Cure Systems, Jun. 2002.

* cited by examiner

STEREOLITHOGRAPHY RESINS AND METHODS

CLAIM OF PRIORITY

This application claims priority to U.S. Patent Application Ser. No. 60/438,496, filed on Jan. 7, 2003, which is hereby incorporated by reference in its entirety.

TECHNICAL FIELD

This invention relates to resins and methods for stereolithography.

BACKGROUND

Rapid prototyping includes a group of technologies that create three-dimensional objects by the successive formation of solid layers from a fluid-like material adjacent to previously formed solid layers of material according to cross-sectional data representing successive slices of the three-dimensional object.

In one type of rapid prototyping, called stereolithography, a liquid material is selectively solidified by exposing it to actinic radiation. The liquid material is typically a photopolymerizable material. The actinic radiation is typically visible or ultraviolet electromagnetic radiation. The radiation can be produced using a laser, though other sources of radiation are possible, such as arc lamps or resistive lamps. Selective exposure may occur by scanning a beam, or by controlling a flood exposure by use of a light valve that selectively transmits or reflects the radiation. After an object has been formed by stereolithography, it can be heat cured. Liquid-based stereolithography is discussed, for example, in U.S. Pat. No. 6,406,658, assigned to 3-D Systems, which is incorporated by reference in its entirety. Examples of stereolithography systems include the SLA 5000 and SLA 7000 models which are sold by 3D Systems, Inc (Valencia, Calif.).

A second type of rapid prototyping is known as selective laser sintering (SLS). SLS is based on the selective solidification of layers of a powdered material by exposing the layers to infrared electromagnetic radiation to sinter or fuse the powder particles. SLS is described, for example, in U.S. Pat. No. 4,863,538, which is incorporated by reference in its entirety.

A third type of rapid prototyping is known as three dimensional printing (3DP). 3DP is based on the selective solidification of layers of a powdered material by the selective deposition (e.g., from an ink-jet printer) of a binder thereon. 3DP is described in U.S. Pat. No. 5,204,055, which is incorporated by reference in its entirety.

SUMMARY

In general, a stereolithography resin can include a urethane acrylate oligomer, an acrylate monomer, and a polymerization modifier. The properties of products made by stereolithography using the resins can be controlled by choosing the identities and relative concentrations of the urethane acrylate oligomer, acrylate monomer, and polymerization modifier. In particular, products having good dimensional stability, toughness, flexibility, heat resistance, or other desirable properties can be made using the resins.

In one aspect, a liquid stereolithography resin includes a first urethane acrylate oligomer, a first acrylate monomer, and a polymerization modifier. In another aspect, a method of forming a three-dimensional object includes choosing a precursor based on a performance characteristic of a finished product, mixing the precursor with a stock solution including a urethane acrylate oligomer and an acrylate monomer to form a stereolithography resin, and selectively exposing the resin to light to form a solidified layer. The performance characteristic can be hardness, flexibility, dimensional stability, clarity, toughness, elasticity, heat resistance, weather resistance, and combinations thereof. In another aspect, a method of forming a three-dimensional object includes selectively exposing to actinic radiation a first portion of a resin including a first urethane acrylate oligomer, a first acrylate monomer, and a polymerization modifier to form a first solidified layer, and selectively exposing to actinic radiation a second portion of the resin to form a second solidified layer adjacent to the first solidified layer.

The liquid stereolithography resin can include a photoinitiator. The photoinitiator can include a phosphine oxide, an alpha-hydroxyketone, benzophenone derivative, or mixtures thereof. The photoinitiator can include a component. The component can be a benzophenone, a benzil dimethyl ketal, a (1-hydroxycyclohexyl)phenylketone, an isopropyl thioxanthone, an ethyl 4-(dimethylamino)benzoate, SARCURE SR1135, (a blend of 2,4,6-trimethylbenzoyldiphenyl phosphine oxide, 2,4,6,-trimethylbenzophenone, 4-methylbenzophenone, and oligo(2-hydroxy-2-methyl-1-(4-(1-methylvinyl)phenyl)propanone), a benzoin normal butyl ether, SARCURE SR1130E, (a blend of oligo(2-hydroxy-2-methyl-1-(4-(1-methylvinyl)phenyl)propane) and poly(2-hydroxy-2-methyl-1-propanone)), tripropyleneglycol diacrylate, an oligo(2-hydroxy-2-methyl-1-(4-(1-methylvinyl)phenyl)propanone), a 2-hydroxy-2-methyl-1-phenyl-1-propanone, a poly(2-hydroxy-2-methyl-1-phenyl-1-propanone), a trimethylolpropane triacrylate, a SARCURE SR1137, (a mixture of 2,4,6-trimethylbenzophenone and 4-methylbenzophenone), a phosphine oxide, a 4-methylbenzophenone, a trimethylbenzophenone, a methylbenzophenone, a Darocur 4265, an IRGACURE, such as IRGACURE 184 1-hydroxy-cyclohexylphenylketone, or mixtures thereof. The photoinitiator can activate polymerization of an acrylate in a wavelength range of 240 nm to 250 nm, 360 nm to 380 nm, or 390 nm to 410 nm.

The first urethane acrylate oligomer can include a polyester urethane diacrylate. The polyester urethane diacrylate can be an aliphatic polyester urethane diacrylate. The first acrylate monomer can include a monovalent acrylate or a polyvalent acrylate.

The first urethane acrylate oligomer can have formula (I):

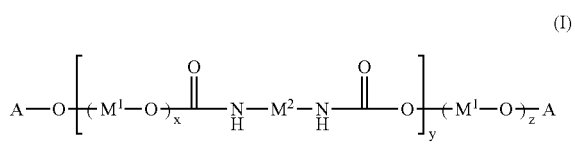

Each $M^1$ is, independently, an alkylene, an acylalkylene, an oxyalkylene, an arylene, an acylarylene, or an oxyarylene. Each $M^2$ is, independently, an alkylene or an arylene. Each $M^1$ and each $M^2$ can be optionally substituted with alkyl, cycloalkyl, alkenyl, cycloalkenyl, alkynyl, acyl, alkoxy, hydroxyl, hydroxylalkyl, halo, haloalkyl, amino, silicone, aryl, or aralkyl. In formula (I), x is a positive integer less than 40, y is a positive integer less than 100, and z is a positive integer less than 40. Each A, independently, has the formula:

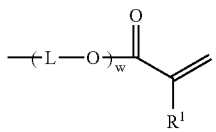

in which $R^1$ is hydrogen or lower alkyl, each L is, independently, $C_1$–$C_4$ alkyl, and w is an integer ranging from 0 to 20. $R^1$ is preferably hydrogen or methyl. In formula (I), w, x, y, and z together are selected such that the molecular weight of the first urethane acrylate oligomer is less than 20,000.

In formula (I), $M^1$ can be a straight, branched, or cyclic alkylene. $M^1$ can be an acylalkylene or acylarylene. $M^2$ can be a straight, branched, or cyclic alkylene. L can be a branched or unbranched $C_1$–$C_4$ alkyl.

The first acrylate monomer can have formula (II):

$R^2$ is a monovalent or polyvalent moiety which can be a $C_1$–$C_{12}$ aliphatic group, an aromatic group, or a poly($C_1$–$C_4$ branched or unbranched alkyl ether). $R^2$ can be optionally substituted with alkyl, cycloalkyl, alkenyl, cycloalkenyl, alkynyl, acyl, alkoxy, hydroxyl, hydroxylalkyl, halo, haloalkyl, amino, aryl, or aralkyl. In formula (II), n is an integer ranging from 0 to 5. Each A' independently has the formula:

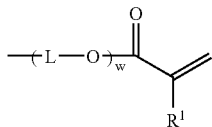

in which $R^1$ is hydrogen or lower alkyl, each L independently is $C_1$–$C_4$ alkyl, and w is an integer ranging from 0 to 20. $R^1$ is preferably hydrogen or methyl. In formula (II), L can be a branched or unbranched $C_1$–$C_4$ alkyl.

The polymerization modifier can include a second acrylate monomer. The second acrylate monomer can have formula (III):

In formula (III), j is 1, 2, 3 or 4, k is equal to 4-j, $R^3$ is hydrogen or $C_1$–$C_4$ branched or unbranched alkyl, each L' independently is $C_1$–$C_4$ branched or unbranched alkyl, and each i independently is 0, 1, 2 or 3. Each A" independently has the formula:

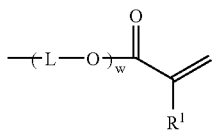

in which $R^1$ is hydrogen or lower alkyl, each L independently is $C_1$–$C_4$ branched or unbranched alkyl, and w is an integer ranging from 0 to 20.

The polymerization modifier can include a second urethane acrylate oligomer. The polymerization modifier can be a trimethylolpropane triacrylate, a bisphenol A dimethacrylate, a tripropyleneglycol diacrylate, a pentaerythritol tetraacrylate, a 2-(2-ethoxyethoxy)ethylacrylate, a tris(2-hydroxyethyl)isocyanurate triacrylate, an isobornyl acrylate, or mixtures thereof. In certain embodiments, the polymerization modifier can include isobornyl acrylate.

The liquid stereolithography resin can include a stabilizer. The stabilizer can be Tinuvin 292 (bis(1,2,2,6,6-pentamethyl-4-piperidyl)sebacate and 1-methyl-10-(1,2,2,6,6-pentamethyl-4-piperidyl)sebacate), Tinuvin 765 (bis(1,2,2,6,6-pentamethyl-4-piperidyl)sebacate), MEQH (4-methoxyphenol), LA-32, (2-(2'-hydroxy-5'-methylphenyl)benzotriazole), LA-82 (1,2,2,6,6-pentamethyl-4-piperidyl methacrylate) or Chimassorb 81 (2-hydroxy-4-octyloxybenzophenone).

In some embodiments, the first urethane acrylate oligomer is SARTOMER CN964, the first acrylate monomer is SARTOMER SR454, (ethoxylated (3) trimethylolpropane acrylate), and the polymerization modifier is SARTOMER SR506, SARTOMER SR494, SARTOMER CN965, SARTOMER SR368, or mixtures thereof. The resin can include 5–35 weight % SARTOMER CN964 and 0.5–25 weight % SARTOMER SR454. The resin can include 0.5–20 weight % SARTOMER SR506. The resin can include 15–45 weight % SARTOMER SR494. The resin can include 0.5–25 weight % SARTOMER CN965. The resin can include 5–35 weight % SARTOMER SR368 (tris-(2-hydroxyethyl)isocyanurate triacrylate).

In other embodiments, the first urethane acrylate oligomer is SARTOMER CN963, the first acrylate monomer is SARTOMER SR306, (tripropyleneglycol diacrylate), and the polymerization modifier is SARTOMER CN970H75, (urethane acrylate oligomer), SARTOMER CD540, SARTOMER SR506, or mixtures thereof. The resin can include 40–70 weight % SARTOMER CN963, and 5–35 weight % SARTOMER SR306. The resin can include 0.5–15 weight % SARTOMER CN970H75. The resin can include 0.5–15 weight % SARTOMER CD540. The resin can include 5–35 weight % SARTOMER SR506.

In other embodiments, the first urethane acrylate oligomer is Sartomer CN966, the first acrylate monomer is Sartomer SR506, and the polymerization modifier is Sartomer SR506, Sartomer CD540, or mixtures thereof. The resin can include 10–40 weight % Sartomer CN966 and 0.5–25 weight % Sartomer SR506. The resin can include 6–35 weight % Sartomer SR506. The resin can include 25–55 weight % Sartomer CD540.

In other embodiments, the first urethane acrylate oligomer is Sartomer CN990, the first acrylate monomer is Sartomer SR506, and the polymerization modifier is Sartomer CN131, BYK Chemie BYK UV 3500, or mixtures thereof. The resin can include 50–80 weight % Sartomer CN990 and 0.5–20 weight % Sartomer SR506. The resin can include 5–35 weight % Sartomer CN131. The resin can include 0.5–15 weight % BYK Chemie BYK UV 3500.

In other embodiments, the first urethane acrylate oligomer is Sartomer CN973, the first acrylate monomer is Sartomer SR506, and the polymerization modifier is Sartomer SR506. The resin can include 45–75 weight % Sartomer CN973 and 10–70 weight % Sartomer SR506.

In other embodiments, the first urethane acrylate oligomer is Sartomer CN963, the first acrylate monomer is Sartomer SR306, and the polymerization modifier is Sartomer CN2400, Sartomer SR506, or mixtures thereof. The resin can include 20–50 weight % Sartomer CN963 and 0.5–25 weight % Sartomer SR306. The resin can include 10–40 weight % Sartomer CN2400. The resin can include 10–40 weight % Sartomer SR506.

In other embodiments, the first urethane acrylate oligomer is Sartomer CN966, the first acrylate monomer is Sartomer SR506, and the polymerization modifier is Sartomer CN131, Sartomer SR506, or mixtures thereof. The resin can include 35–60 weight % Sartomer CN966 and 10–25 weight % Sartomer SR506. The resin can include 10–45 weight % Sartomer SR506. The resin can include 5–35 weight % Sartomer CN131.

The stock solution can include a photoinitiator and a stabilizer. The desired characteristic of the finished product can be dimensional stability and the precursor can be isobornyl acrylate.

In accordance with one embodiment of the present invention, a photocurable resin composition is provided which comprises a urethane acrylate oligomer having a functionality of 2, an ethoxylated$_3$ trimethylolpropane acrylate monomer, an ethoxylated pentaerythritol tetraacrylate and one or more photoinitiators. In some embodiments a stabilizer is included in these compositions.

In accordance with other embodiments of the present invention, photocurable resin compositions for preparing a flexible object are provided. One such resin is provided which comprises: a urethane acrylate oligomer, an ethoxylated$_3$ trimethylolpropane triacrylate monomer, an alkoxylated cyclohexane diacrylate and one or more photoinitiators. In some embodiments a stabilizer is included in these compositions.

In other embodiments of the present invention, a photocurable resin composition for preparing flexible objects is provided which comprises a urethane acrylate oligomer, an ethoxylated$_3$ trimethylolpropane triacrylate monomer, a polyester acrylate ester and one or more photoinitiators. In some embodiments a stabilizer is included in these compositions.

In other embodiments of the present invention, a photocurable resin composition for preparing super flexible objects is provided which comprises a urethane acrylate oligomer, an ethoxylated$_3$ trimethylolpropane triacrylate monomer, a polyethylene glycol diacrylate and one or more photoinitiators. In some embodiments a stabilizer is included in these compositions.

In accordance with another embodiment of the present invention, a photocurable resin composition for preparing a super high heat resistant object is provided which comprises: a urethane acrylate oligomer, an ethoxylated$_3$ trimethylolpropane acrylate monomer a triacrylate monomer, one or more photoinitiators and one of a tetra-acrylate monomer (such as an ethoxylated pentaerythritol tetraacrylate) and a monoacrylate monomer. In some embodiments, a stabilizer is included in these compositions.

In accordance with other embodiments of the present invention, three dimensional objects are provided which are prepared using the photocurable resins described above. Such three dimensional objects have desirable properties for many different commercial, industrial and consumer applications.

In accordance with still other embodiments of the present invention, methods for manufacturing objects by stereolithography using the photocurable resins described above are provided.

In accordance with another embodiment of the present invention, a method for manufacturing a three-dimensional object by stereolithography is provided, comprising the steps of: (a) forming a layer of one of the photocurable resin compositions described in the above embodiments; (b) applying actinic radiation to cure at least a portion of the layer of the photocurable resin composition form a cured layer; (c) introducing a new layer of the photocurable resin composition onto the cured layer; (d) applying actinic radiation to the new layer of the photocurable resin composition to form a cured layer; (e) repeating steps (c) and (d) until the three-dimensional object is manufactured.

The various embodiments of the present invention provide a number of advantages. For example, embodiments of the present invention provide different curable resin compositions which, after curing, produce objects that have material properties useful in different industrial, consumer and commercial contexts.

Another advantage is that the different photocurable resin compositions described above have been tailored to produce objects, after these resins have been cured, that have different useful performance characteristics. Some embodiments of the invention provide resins that produce objects that are flexible after curing. Some embodiments of the invention provide resins that produce objects that can withstand high heat and maintain some flexibility (i.e., they are not brittle) after curing. Some embodiments of the invention provide resins that produce objects that are tough and hard after curing.

Another advantage is that the embodiments of the present invention provide a fast build speed and superior green strength for easy post cure processing. This saves time and laser energy.

Another advantage of the various embodiments of the invention is that photocurable resins can be provided that require little or no post cure processing.

Another advantage of the invention is that the photocurable resins in accordance with the embodiments of the present invention prevent, or have greatly reduced volume shrinkage, as compared to urethane acrylates previously available, accompanying photosetting such that they maintain form precision when used in stereolithography.

Another advantage is that the photocurable resins provided by the embodiments of the present invention is that, in comparison to epoxy resins, they are not sensitive to humidity and do not absorb water or swell.

A stereolithography resin can include an epoxy-acrylate resin. Epoxy-acrylate resins can suffer from excessive shrinkage upon curing, insufficient flexibility, insufficient toughness, or insufficient strength.

When formulating a resin for stereolithography, it can be important to control cure speed. Fast curing enables the stereolithographer to input conservative build parameters into stereolithography instrumentation to produce parts that are dimensionally accurate (within the limitations of the actual technology). Stereolithography resins having faster cure speeds can therefore be advantageous.

Stereolithography resins can preferably be formulated to enable the stereolithographer to finish parts without damage. Parts produced using stereolithographic instrumentation (e.g., those sold by 3D Systems) can be produced with support structures that encumber much of the part. Removal of these support structures prior to performing a finish cure and/or any finish application (i.e., in the green state) on the parts being processed can damage the product.

It can be preferable for photocurable resins useful for stereolithography to have dimensional stablity and accuracy both during and after processing, to provide mechanical and physical stability in multiple environments exhibiting build chamber condition independence (i.e., the resin can be cured by laser light of various wavelengths), and to have high heat deflection temperatures and low shrinkage after curing. It can be preferable for resins to cure faster than currently available resins while maintaining performance characteristics that fit applicable materials design. There is a need for resins that are mechanically strong during the green state with easy-to-remove support structure. This can allow the operator to achieve and/or preserve fine smooth surfaces and thin walls (e.g. 0.045 inches thick). The properties of the green state are determined by the characteristics of the stereolithographic resin used.

Stereolithographic resins can exhibit a number of advantageous properties such as improved flexibility and high temperature resistance for the cured products. Preferably, the resins have superior curing speeds as compared with commercially available stereolithography resins. Moreover, the resins can be cured over a wide range of light wavelengths, for example, the resins can be cured with light in the range of 240 nm to 250 nm, 360 nm to 380 nm, or 390 nm to 410 nm.

The details of one or more embodiments are set forth in the description below. Other features, objects, and advantages will be apparent from the description and from the claims.

DETAILED DESCRIPTION

The properties of a product made by stereolithography can be controlled by the stereolithography resin from which it is made. The resin can be formulated such that products made from it are, for instance, dimensionally stable, flexible, or tough, or have the characteristics of a soft rubber, a medium rubber, or a hard rubber. The degree to which a product has one or more of these properties can be controlled by the choice of components in a resin, and the relative amounts of the components in the resin.

The resin can include a urethane acrylate oligomer an acrylate monomer, a polymerization modifier, or a combination thereof. Each of these can be selected individually, or a blend of urethane acrylate oligomer and an acrylate monomer can be precombined as a stock solution, for the production of photocurable resins having different performance characteristics. A variety of resins useful for stereolithography can be prepared from this stock solution, such as a general purpose resin, a tough resin, a flexible resin, a super flexible resin, a soft rubber resin, a medium rubber resin, a hard rubber resin, or a metallic resin. Typically, the performance characteristics are selected by adding a polymerization modifier to the stock solution. A polymerization modifier alters properties of a product, flexibility, and toughness. A polymerization modifier can include, for example, a urethane acrylate oligomer, an acrylate monomer, or both. A photoinitiator and stabilizer can also be added to the stock solution and polymerization modifier to form a stereolithography resin. The identity and relative proportion of the polymerization modifier added to the stock solution can influence the properties of a product produced from the resin.

A urethane acrylate oligomer can have formula (I):

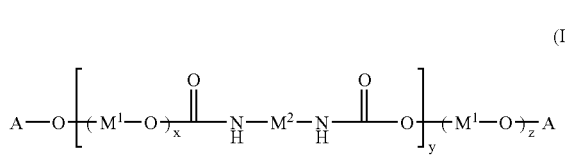

Each $M^1$ is, independently, an alkylene, an acylalkylene, an oxyalkylene, an arylene, an acylarylene, or an oxyarylene. Each $M^2$ is, independently, an alkylene or an arylene. Each $M^1$ and each $M^2$ are optionally substituted with alkyl, cycloalkyl, alkenyl, cycloalkenyl, alkynyl, acyl, alkoxy, hydroxyl, hydroxylalkyl, halo, haloalkyl, amino, silicone, aryl, or aralkyl. In formula (I), x is a positive integer less than 40, y is a positive integer less than 100, and z is a positive integer less than 40. Each A, independently, has the formula:

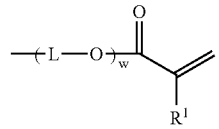

$R^1$ is hydrogen or lower alkyl, each L is, independently, $C_1$–$C_4$ alkyl, and w is an integer ranging from 0 to 20. In formula (I), w, x, y, and z together are selected such that the molecular weight of the first urethane acrylate oligomer is less than 20,000. More particularly, $M^1$ can be acylalkylene and $M^2$ can be alkylene or arylene. Examples of urethane acrylate oligomers include CN963, CN964, CN965, CN966, CN970, CN973, and CN990, all of which are available from Sartomer (Exton, Pa.).

An acrylate monomer can have formula (II):

$$A'\text{-}O\text{---}R^2\text{---}(O\text{-}A')_n \qquad (II)$$

$R^2$ is a monovalent or polyvalent moiety which can be a $C_1$–$C_{12}$ aliphatic group, an aromatic group, or a poly($C_1$–$C_4$ branched or unbranched alkyl ether). $R^2$ is optionally substituted with alkyl, cycloalkyl, alkenyl, cycloalkenyl, alkynyl, acyl, alkoxy, hydroxyl, hydroxylalkyl, halo, haloalkyl, amino, aryl, or aralkyl. In formula (II), n is an integer ranging from 0 to 5. Each A' has the formula:

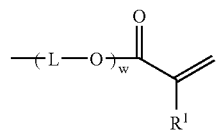

$R^1$ is hydrogen or lower alkyl, each L independently is $C_1$–$C_4$ alkyl, and w is an integer ranging from 0 to 20. More particularly, an acrylate monomer can have formula (III):

$$(R^3)_k\text{---}C\text{-}[(L'\text{-}O_i\text{-}A'')]_j \qquad (III)$$

In formula (III), j is 1, 2, 3 or 4, k is equal to 4-j, $R^3$ is hydrogen or $C_1$–$C_4$ branched or unbranched alkyl, each L' independently is $C_1$–$C_4$ branched or unbranched alkyl, and each i independently is 0, 1, 2 or 3. Each A" independently has the formula:

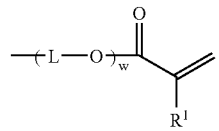

$R^1$ is hydrogen or lower alkyl, each L independently is $C_1$–$C_4$ branched or unbranched alkyl, and w is an integer ranging from 0 to 20. Examples of acrylate monomers include ethoxylated trimethylolpropane triacrylate, ethoxylated bisphenol A dimethacrylate, tripropyleneglycol diacrylate, pentaerythritol tetraacrylate, 2-(2-ethoxyethoxy)ethylacrylate, tris(2-hydroxyethyl)isocyanurate triacrylate, and isobornyl acrylate, all of which are available from Sartomer (Exton, Pa.).

A polymerization modifier can include a second urethane acrylate oligomer or a second acrylate monomer. The urethane acrylate oligomer can be the same or different as the first urethane acrylate oligomer in the resin. The second acrylate monomer can be the same or different as the first acrylate monomer in the resin. The second acrylate monomer can be a monovalent acrylate, for example isobornyl acrylate, or a polyvalent acrylate, such as a di, tri, tetra, penta or higher acrylate, for example a bisphenol A dimethacrylate, a trimethylolpropane triacrylate, an ethoxylated pentaerythritol tetraacrylate, or an isocyanurate triacrylate.

A stereolithography resin can be formulated for general purpose products (a general purpose resin). A product prepared from a general purpose resin can be useful in products such as parts that snap-fit together or that have clips that need some flexibility. A general purpose resin can be useful, among other applications, for PDA (personal data assistant) housings, blender housings and cell phone housings.

A stereolithography resin can be formulated for flexible products (a flexible resin). A product prepared from a flexible resin can be flexible and can be especially useful for simulating rubber and silicone type materials. A flexible resin can be useful in, for example, gaskets, dive masks, switch knobs, face masks for respirators and cell phone keypads. More particularly, a stereolithography resin can be formulated for preparing products with a moderate flexibility (a mid flex resin). A product prepared from a mid flex resin can be suitable for the construction of pieces such as hinges, caps, rigid packaging (bottles, cases, etc.) and others. A product prepared from a mid flex resin can show moderate flexibility and low resistance to plastic deformation, and can emulate the mechanical properties of high-density polyethylene (HDPE). A product prepared from a super flex resin can be more flexible than a mid flex resin.

A stereolithography resin can be formulated for a product that is resistant to high heat (a high heat resin). A product resistant to high heat can have a flexibility of about 10 degrees before breaking and a $T_g$ of about 460° F. In contrast, typical commercially available resins yield products that are extremely brittle and have $T_g$ values of between 350 and 400° F. A high heat resin can be used effectively, for example, in test components for automotive engines, aerospace applications, engine blocks or manifold, jet engine components and heat sinks. A high heat resin can emulate the thermal properties of polyamides.

A stereolithography resin can be formulated for preparing a tough and hard product (a tough and hard resin). A product made from a tough and hard resin can be difficult to break and relatively inflexible. A tough and hard resin can be useful for simulating production materials such as ABS plastic, for instance in automotive parts, power tool components and cell phone housings.

A stereolithography resin can be formulated for preparing products with high toughness (a tough resin). A product prepared from a tough resin can require moderate to high stresses to produce deformation, can be resistant to fatigue and can deform in large extensions without breaking (plastic deformation), for example, elongation of 85–180% without breaking. A tough resin can emulate the properties of polycarbonate and polypropylene, and can be suitable for the construction of products that require high mechanical resistance, such as gear wheels, engine parts, and PDA and cellular phones cases.

A stereolithography resin can be formulated for preparing products with characteristics of a soft rubber (a soft rubber resin). A product prepared from a soft rubber resin can be flexible, elastic and offer low resistance to elastic deformation. A product prepared from a soft rubber resin can have a Shore D hardness in the range of 10–20. Such resins can emulate the properties of elastomers such as polybutadiene and polyisoprene, and can be suitable for the construction of products such as gaskets, engine belts, cell phone keypads, tubing, or medical devices. Also, the soft rubber resin can be used to emulate human tissues.

A stereolithography resin can be formulated for preparing products with the characteristics of a rubber with medium stiffness (a mid-rubber resin). An object prepared from the mid rubber resin can be flexible, with good hardness and superficial properties (i.e. resistance to abrasion) and resistant to elastic deformation. A product prepared from a mid-rubber resin can have a Shore D hardness in the range of 30–45. Such resins can simulate the physical properties of silicone rubbers, making it suitable for the construction of products such as respirator masks, catheters, cell phone keypads, o-rings, or cushion pads.

A stereolithography resin can be formulated for preparing products with the characteristics of a hard rubber (a hard rubber resin). A product prepared from a hard rubber resin can be flexible and elastic, with high hardness and can require high stress to produce an elastic deformation. A product prepared from a hard rubber resin can have a Shore D hardness in the range of 60–80. A product prepared form a hard rubber resin can emulate highly cross-linked elastomers, rubbers with inorganic fillers, polyurethane elastomers, nitrile-butadiene rubber (NBR) and styrene-butadiene rubber (SBR), and can be suitable for the construction of products such as shoe soles, engine belts, or tires.

A stereolithography resin can be formulated for preparing products with metallic properties (a metallic resin). An object prepared from a metallic resin can be strong and virtually not deformable, can emulate the properties of a polyacetal, and can be suitable for the construction of products that require extreme mechanical resistance without any kind of deformation and high resistance over time.

A general purpose resin can include a urethane acrylate oligomer, an acrylate monomer, and a polymerization modifier. The urethane acrylate oligomer can include an aliphatic polyester urethane diacrylate. The acrylate monomer can include a polyvalent acrylate, for example an ethoxylated trimethylolpropane acrylate. The polymerization modifier can include a polyvalent acrylate, such as a di, tri, tetra, penta or higher acrylate, for example, an ethoxylated pentaerythritol tetraacrylate, or an isocyanurate triacrylate. The polymerization modifier can include a second urethane acrylate oligomer. The resin can also include a photoinitiator and a stabilizer.

A flexible resin can include a urethane acrylate oligomer, an acrylate monomer, and a polymerization modifier. The urethane acrylate oligomer can include an aliphatic polyester urethane diacrylate. The acrylate monomer can include a polyvalent acrylate, such as an ethoxylated trimethylolpropane triacrylate, or a monovalent acrylate, such as isobornyl acrylate. The polymerization modifier can include an alkoxylated cyclohexane diacrylate, isobornyl acrylate, an ethoxylated bisphenol A diacrylate, or mixtures thereof. The resin can also include a photoinitiator and a stabilizer.

A mid flex resin can include a urethane acrylate oligomer, an acrylate monomer, and a polymerization modifier. The urethane acrylate oligomer can include an elastic urethane acrylate oligomer. The acrylate monomer can include a monovalent acrylate such as isobornyl acrylate. The polymerization modifier can include a polyvalent acrylate such as an ethoxylated bisphenol A dimethacrylate. The resin can include a photo-initiator and a stabilizer.

A super flex resin can include a urethane acrylate oligomer, an acrylate monomer, and a polymerization modifier. The urethane acrylate oligomer can include an aliphatic polyester urethane diacrylate, or a siliconized urethane acrylate oligomer. The acrylate monomer can include a diacrylate such as a polyethylene glycol diacrylate, or a monoacrylate such as isobornyl acrylate. The polymerization modifier can include a second urethane acrylate oligomer, a low viscosity aromatic monoacrylate oligomer, or a polyether modified acrylic functional polydimethylsiloxane.

A high heat resin can include a urethane acrylate oligomer, an acrylate monomer, and a polymerization modifier. The urethane acrylate oligomer can include an aliphatic polyester urethane diacrylate, an aromatic polyester urethane diacrylate, or a combination. The acrylate monomer can include a monovalent acrylate, such as isobornyl acrylate or a polyvalent acrylate, such as an ethoxylated bisphenol A diacrylate. The polymerization modifier can include a polyvalent acrylate, such as an isocyanurate triacrylate. The resin can also include a photoinitiator and a stabilizer.

A tough and hard resin can include a urethane acrylate oligomer, an acrylate monomer, and a polymerization modifier. The urethane acrylate oligomer can include an aliphatic polyester urethane diacrylate, an aromatic polyester urethane diacrylate, or a combination. The acrylate monomer can include a polyvalent acrylate, such as an ethoxylated trimethylolpropane triacrylate, or a 2-(2-ethoxyethoxy)ethylacrylate. The polymerization modifier can include a second urethane acrylate oligomer which can be an aliphatic polyester urethane diacrylate, a monovalent acrylate, such as isobornyl acrylate, a polyvalent acrylate, such as an ethoxylated bisphenol A diacrylate, or a combination. The resin can also include a photoinitiator and a stabilizer.

A tough resin can include a urethane acrylate oligomer, an acrylate monomer, and a polymerization modifier. The urethane acrylate oligomer can include an aromatic urethane acrylate oligomer. The acrylate monomer can include a polyvalent acrylate such as an ethoxylated bisphenol A dimethacrylate. The polymerization modifier can include an aliphatic urethane acrylate oligomer, a tripropyleneglycol diacrylate, an isocyanurate triacrylate, isobornyl acrylate, or a combination. The polymerization modifier can include tris(2-hydroxyethyl) isocyanurate triacrylate, which can allow control of the ultimate resistance to mechanical stress. The resin can include a photo-initiator and a stabilizer.

A soft rubber resin can include a urethane acrylate oligomer, an acrylate monomer, and a polymerization modifier. The urethane acrylate oligomer can include a siliconized urethane acrylate oligomer. The acrylate monomer can include a monovalent acrylate such as isobornyl acrylate. The polymerization modifier can include a low viscosity aromatic monoacrylate oligomer. The resin can include a photo-initiator and a stabilizer.

A mid-rubber resin can include a urethane acrylate oligomer, an acrylate monomer, and a polymerization modifier. The urethane acrylate oligomer can include a siliconized urethane acrylate oligomer. The acrylate monomer can include a monovalent acrylate such as isobornyl acrylate. The polymerization modifier can include a low viscosity aromatic monoacrylate oligomer, a polyether modified acrylic functional polydimethylsiloxane, or a combination. The resin can include a photo-initiator and a stabilizer.

A hard rubber resin can include a urethane acrylate oligomer, an acrylate monomer, and a polymerization modifier. The urethane acrylate oligomer can include an aromatic urethane acrylate oligomer. The acrylate monomer can include a monovalent acrylate such as isobornyl acrylate. The polymerization modifier can include a monovalent acrylate such as isobornyl acrylate. The resin can include a photo-initiator and a stabilizer.

A metallic resin can include a urethane acrylate oligomer, an acrylate monomer, and a polymerization modifier. The urethane acrylate oligomer can include an aliphatic urethane acrylate. The acrylate monomer can include a polyvalent acrylate such as a tripropyleneglycol diacrylate. The polymerization modifier can include a monovalent acrylate such as isobornyl acrylate. The polymerization modifier can include a metallic acrylic oligomer.

Tables 1–9, below, illustrate various embodiments. Tables 1A and 1B describe general purpose resins. Tables 2A and 2B describe mid-flex resins. Tables 3A and 3B describe super flex resins. Table 4 describes a high-heat resin. Tables 5A and 5B describe tough resins. Table 6 describes a soft rubber resin. Table 7 describes a mid rubber resin. Table 8 describes a hard rubber resin. Table 9 describes a metallic resin. In the tables, the first column identifies the commercially available product used for each component, the second column describes the various components (e.g. urethane acrylate oligomer, photoinitiator, or stabilizer).

TABLE 1A

| Components | Type | Broad range (Volume %) | Preferred range (Volume %) | Actual composition (Volume %) |
|---|---|---|---|---|
| CN964E75 | urethane acrylate oligomer | 18–42 | 25–35 | 30 |
| SR494 | tetraacrylate monomer | 20–44 | 27–37 | 32 |
| CN965 | urethane acrylate oligomer | 1–24 | 7–17 | 12 |
| SR368 | triacrylate monomer | 4–28 | 11–21 | 16 |
| Darocur 4265 | photoinitiator | 1–14 | 1–7 | 2 |
| TIN292 | stabilizer | 1–20 | 3–13 | 8 |

TABLE 1B

| Components | Type | Broad range (% w/w) | Preferred range (% w/w) |
|---|---|---|---|
| CN964E75 | urethane acrylate oligomer | 14.8–38.8 | 21.8–31.8 |
|  | aliphatic urethane acrylate (CN964) | 8.1–32.1 | 15.1–25.1 |
|  | ethoxylated$_3$ trimethylolpropane triacrylate ester | 1–18.7 | 1.7–11.7 |

TABLE 1B-continued

| Components | Type | Broad range (% w/w) | Preferred range (% w/w) |
|---|---|---|---|
| SR506 | isobornyl acrylate | 1–14 | 1–7 |
| SR494 | ethoxylated$_4$ pentaerythritol tetraacrylate | 19.5–43.5 | 26.5–36.5 |
| CN965 | urethane acrylate oligomer | 1–23.4 | 6.4–16.4 |
| SR368 | tris(2-hydroxyethyl) isocyanurate triacrylate | 6.2–30.2 | 13.2–23.2 |
| Darocur 4265 | photoinitiator | 1–14.4 | 1–7.4 |
| TIN292 | stabilizer | 1–19.7 | 2.7–12.7 |

TABLE 2A

| Components | Type | Broad range (Volume %) | Preferred range (Volume %) | Actual composition (Volume %) |
|---|---|---|---|---|
| CN964E75 | urethane acrylate oligomer | 22–46 | 29–39 | 34 |
| SR494 | tetraacrylate monomer | 15–39 | 22–32 | 27 |
| CN965 | urethane acrylate oligomer | 7–31 | 14–24 | 19 |
| CN738 | polyester acrylic ester | 1–23 | 6–16 | 11 |
| Darocur 4265 | photoinitiator | 1–14 | 1–7 | 2 |
| TIN292 | stabilizer | 1–19 | 2–12 | 7 |

TABLE 2B

| Components | Type | Broad range (% w/w) | Preferred range (% w/w) |
|---|---|---|---|
| CN966J75 | urethane acrylate oligomer | 21.5–45.5 | 28.5–38.5 |
| | aliphatic urethane acrylate (CN966) | 13.1–37.1 | 20.1–30.1 |
| | isobornyl acrylate | 1–20.4 | 3.4–13.4 |
| SR506 | isobornyl acrylate | 6.5–30.5 | 13.5–23.5 |
| CD540 | ethoxylated$_4$ bisphenol A dimethacrylate | 29.8–53.8 | 36.8–46.8 |
| TIN292 | photoinitiator | 1–16.1 | 1–9.1 |
| DARO | stabilizer | 1–14.1 | 1–7.1 |

TABLE 3A

| Components | Type | Broad range (Volume %) | Preferred range (Volume %) | Actual composition (Volume %) |
|---|---|---|---|---|
| CN964E75 | urethane acrylate oligomer | 26–50 | 33–43 | 38 |
| CN965 | urethane acrylate oligomer | 3–27 | 10–20 | 15 |
| CN966J75 | urethane acrylate oligomer | 3–27 | 10–20 | 15 |
| SR344 | diacrylate monomer | 11–35 | 18–28 | 23 |
| Darocur 4265 | photoinitiator | 1–14 | 1–7 | 2 |
| TIN292 | stabilizer | 1–19 | 2–12 | 7 |

TABLE 3B

| Components | Type | Broad range (% w/w) | Preferred range (% w/w) |
|---|---|---|---|
| CN990 | siliconized urethane acrylate oligomer | 52.4–76.4 | 59.4–69.4 |
| CN131 | low viscosity aromatic monoacrylate oligomer | 9.1–33.1 | 16.1–26.1 |
| SR506 | isobornyl acrylate | 1–18.7 | 1.7–11.7 |
| BYK3500 | polyether modified acrylic functional polydimethylsiloxane | 1–13 | 1–6 |
| TIN292 | photoinitiator | 1–16.3 | 1–9.3 |
| DARO | stabilizer | 1–14.5 | 1–7.5 |

TABLE 4

| Components | Type | Broad range (Volume %) | Preferred range (Volume %) | Actual composition (Volume %) |
|---|---|---|---|---|
| CN964E75 | urethane acrylate oligomer | 15–39 | 22–32 | 27 |
| SR506 | monoacrylate monomer | 2–26 | 9–19 | 14 |
| CN965 | urethane acrylate oligomer | 1–22 | 5–15 | 10 |
| SR368 | triacrylate monomer | 28–52 | 35–45 | 40 |
| Darocur 4265 | photoinitiator | 1–15 | 1–8 | 3 |
| TIN292 | stabilizer | 1–18 | 1–11 | 6 |

TABLE 5A

| Components | Type | Broad range (Volume %) | Preferred range (Volume %) | Actual composition (Volume %) |
|---|---|---|---|---|
| CN964E75 | urethane acrylate oligomer | 4–28 | 11–21 | 16 |
| CN963A80 | urethane acrylate oligomer | 25–49 | 32–42 | 37 |
| SR506 | monoacrylate monomer | 25–49 | 32–42 | 37 |
| Darocur 4265 | photoinitiator | 1–15 | 1–8 | 3 |
| TIN292 | stabilizer | 1–19 | 2–12 | 7 |

TABLE 5B

| Components | Type | Broad range (% w/w) | Preferred range (% w/w) |
|---|---|---|---|
| CN970H75 | urethane acrylate oligomer | 1–13.1 | 1–6.1 |
| | aromatic urethane acrylate (CN970) | 1–12.8 | 1–5.8 |
| | 2-(2-ethoxyethoxy) ethylacrylate | 1–12.3 | 1–5.3 |
| CD540 | ethoxylated₄ bisphenol A dimethacrylate | 1–13 | 1–6 |
| CN963A80 | urethane acrylate oligomer | 60–84 | 67–77 |
| | aliphatic urethane acrylate (CN963) | 42–66 | 49–59 |
| | tripropyleneglycol diacrylate | 6–30 | 13–23 |
| SR506 | isobornyl acrylate | 7.3–31.3 | 14.3–24.3 |
| Darocur 4265 | photoinitiator | 1–14.5 | 1–7.5 |
| TIN292 | stabilizer | 1–16.1 | 1–9.1 |

TABLE 6

| Components | Type | Broad range (% w/w) | Preferred range (% w/w) |
|---|---|---|---|
| CN966J75 | siliconized urethane acrylate oligomer | 54.1–78.1 | 61.1–71.1 |
| CN131 | low viscosity aromatic monoacrylate oligomer | 8.9–32.9 | 15.9–25.9 |
| SR506 | isobornyl acrylate | 1–18.7 | 1.7–11.7 |
| Darocur 4265 | photoinitiator | 1–14.1 | 1–7.1 |
| TIN292 | stabilizer | 1–16.2 | 1–9.2 |

TABLE 7

| Components | Type | Broad range (% w/w) | Preferred range (% w/w) |
|---|---|---|---|
| CN990 | siliconized urethane acrylate oligomer | 52.4–76.4 | 59.4–69.4 |
| CN131 | low viscosity aromatic monoacrylate oligomer | 9.1–33.1 | 16.1–26.1 |
| SR506 | isobornyl acrylate | 1–18.7 | 1.7–11.7 |
| BYK3500 | polyether modified acrylic functional polydimethylsiloxane | 1–13 | 1–6 |
| TIN292 | photoinitiator | 1–16.3 | 1–9.3 |
| DARO | stabilizer | 1–14.5 | 1–7.5 |

TABLE 8

| Components | Type | Broad range (% w/w) | Preferred range (% w/w) |
|---|---|---|---|
| CN973J75 | urethane acrylate oligomer | 66–90 | 73–83 |
| | aromatic urethane acrylate (CN973) | 46.5–70.5 | 53.5–63.5 |
| | isobornyl acrylate | 7.5–31.5 | 14.5–24.5 |
| SR506 | isobornyl acrylate | 3.6–27.6 | 10.6–20.6 |
| TIN292 | photoinitiator | 1–16.3 | 1–9.3 |
| DARO | stabilizer | 1–14.1 | 1–7.1 |

TABLE 9

| Components | Type | Broad range (% w/w) | Preferred range (% w/w) |
|---|---|---|---|
| CN2400 | metallic acrylic oligomer | 12.3–36.3 | 19.3–29.3 |
| CN963A80 | urethane acrylate oligomer | 33–57 | 40–50 |
| | aliphatic urethane acrylate (CN963) | 21.8–45.8 | 28.8–38.8 |
| | tripropyleneglycol diacrylate | 1–23.3 | 6.3–16.3 |
| SR506 | isobornyl acrylate | 12.3–36.3 | 19.3–29.3 |
| Darocur 4265 | photoinitiator | 1–14.3 | 1–7.3 |
| TIN292 | stabilizer | 1–16.1 | 1–9.1 |

The stereolithography resin can include photoinitiators. Photoinitiators generally accelerate curing. Photoinitiators can be present in the resin compositions in amounts from about 1 weight % to about 20 weight %. Preferably, the photoinitiators are present in the stereolithography resin from about 1 weight % to about 10 weight %. In some preferred embodiments of the photoinitiator is present in about 2 weight % to about 3 weight %.

A combination of photoinitiators can be used so that light of different wavelength ranges can be used to facilitate curing of the resins. For example, photoinitiators can be chosen such that the photocurable resin composition can be cured at wavelengths of about 240 nm to about 250 nm, about 360 nm to about 380 nm, or about 390 nm to about 410 nm. Resins having photoinitiators that allow for curing to occur at different wavelengths allow the use of a variety of light sources, such as a He/Cd laser, an argon laser, or various SLA instruments such as SLA 5000 or SLA 7000.

A combination of a phosphine oxide, an alpha-hydroxy ketone and a benzophenone derivative can be used as photoinitiators in the resin. This combination allows curing at different wavelengths. Such a combination of photoinitiators is sold by Sartomer, Inc. as SR1135 and is most useful in the wavelength ranges of about 240 nm to about 250 nm, about 260 nm to about 380 nm, and about 390 nm to about 410 nm. The photoinitiators are preferably present in the resins described above at weight percentages effective for initiating the light sensitive curing process. One skilled in the art can determine how much photoinitiator should be added for different photoinitiators and applications.

Many photoinitiators are known in the art and can be used with the stereolithography resins either singly or in a mixture. Examples of photoinitiators include a benzophenone, a benzil dimethyl ketal, a 1-hydroxy-cyclohexylphenylketone, an isopropyl thioxanthone, an ethyl 4-(dimethylamino)benzoate, SARCURE SR1135, a benzoin normal butyl ether, SARCURE SR1130E, tripropyleneglycol diacrylate, an oligo(2-hydroxy-2-2-methyl-1-(4-(1-methylvinyl)phenyl) propanone), a 2-hydroxy-2-methyl-1-phenyl-1-propanone, a poly(2-hydroxy-2-methyl-1-phenyl-1-propanone), a trimethylolpropane triacrylate, a SARCURE SR1137, a SARCURE SR1130, a phosphine oxide, a 4-methylbenzophenone, a trimethylbenzophenone, a methylbenzophenone, a Darocur 4265, and an Irgacure. Upon application of light, photoinitiators produce reactive species that initiate rapid cure processes. A resin that includes photoinitiators is best stored in an environment in which it is protected from light. In certain preferred embodiments the photoinitiator is SARCURE SR1135. In other preferred embodiments the photoinitiator is DAROCURE-4265, available from CIBA Specialty Chemicals Corp.

The photocurable resin compositions can include light stabilizers. For example, Tinuvin 292 (TIN292) (bis(1,2,2,6,6-pentamethyl-4-piperidyl)sebacate and 1-(methyl)-10-(1,2,2,6,6-pentamethyl-4-piperidyl)sebacate) can be used as a stabilizer. Other stabilizers that can be used include, for example, Tinuvin 765 (bis(1,2,2,6,6-pentamethyl-4-piperidyl)sebacate) available from CIBA Specialty Chemicals, BLS 292 (bis (1,2,2,6,6-pentamethyl-4-piperidyl)sebacate and 1-(methyl)-10-(1,2,2,6,6-pentamethyl-4-piperidyl) sebacate) available from Mayzo Inc, LA-32 or LA-82 available from ADK Stab, MEQH (4-methoxyphenol) available from Aldrich Chemical Company, Inc. and Chimassorb 81, available from Ciba Specialty Chemicals.

An inert fill can be included in the resins and improve performance characteristics of the resins. Inert fills reduce shrink to near zero. Such inert fills can include nanoclays and titanium dioxide. In various embodiments nanoclays such as Cloisite N and Cloisite 20A can be used.

In general, a stereolithography resin can be prepared from a urethane acrylate oligomer and an acrylate monomer that are blended with a polymerization modifier. The urethane acrylate oligomer and the acrylate monomer can be preblended in a commercially available mixture. The identity and relative concentrations of the urethane acrylate oligomer, acrylate monomer, and polymerization modifier can be selected to produce a resin with desired characteristics. To this is added a photoinitiator which preferably includes a blend of phosphine oxide, alpha-hydroxy ketone and a benzophenone derivative. To this is added a stabilizer. The mixture is then placed in a mixing hopper and then undergoes a mixing cycle using a motorized mixer.

In some embodiments, the resins are used in methods for producing three dimensional objects using stereolithography. In general, stereolithography is carried out by forming a layer of a photocurable resin composition and applying actinic radiation to cure at least a portion of the layer of the photocurable resin composition form a cured layer. Then, a new layer of the photocurable resin composition is introduced onto the cured layer, actinic radiation is applied to the new layer of the photocurable resin composition to form another cured layer. These steps are repeated until a three dimensional object is manufactured. This methodology is well known in the art. See, for example, Jacobs, Paul F., *Stereolithography and other RP & M Technologies* (ASME Press, 1996), which is incorporated by reference in its entirety.

The resins are cured with actinic radiation. The actinic radiation in preferred embodiments is provided by a laser. Suitable lasers are known in the art. For stereolithography applications, lasers are ordinarily provided with the stereolithography machine. Stereolithographic instruments that can be used include, for example, SLA 5000, or SLA 7000. Stereolithographic instruments can be purchased from 3D Systems (Valencia, Calif.).

In certain embodiments, three dimensional objects are prepared with the stereolithography resins described herein. Such three dimensional objects have properties depending on the stereolithography resin employed.

EXAMPLE 1

A general purpose resin was prepared with the following components, which are listed both as a % by volume and as a percent by weight:

| COMPONENT | % VOLUME | % BY WEIGHT |
| --- | --- | --- |
| CN964E75 | 38.25 | 37.83 |
| SR494 | 48 | 48.74 |
| CN965 | 10 | 9.9 |
| SR1135 | 1.75 | 1.75 |
| TIN292 | 2 | 1.78 |

In this regard, it should be noted that CN964E75 and CN965 both contain urethane acrylate oligomers. SR494 is an ethoxylated pentaerythritol tetraacrylate. SR1135 is a photoinitiator and TIN292 is a stabilizer. In particular, CN964E75 includes an aliphatic urethane acrylate (75 to 90% by weight) and ethoxylated trimethylolpropane triacrylate esters (10 to 25% by weight). SR494 is an ethoxylated pentaerythritol tetraacrylate (100% by weight). CN965 is an aliphatic urethane acrylate (100% by weight). SR1135 is a mixture including 2,4,6-trimethylbenzoyldiphenylphosphine oxide, alpha hydroxyketones and benzophenone derivatives and includes 2-hydroxy-2-methyl-1-phenyl-1-propanone (22 to 26% by weight) and 2,4,6-trimethylbenzophenone (6 to 7% by weight). TIN292 can be purchased from CIBA, Inc. All of the other components are sold by Sartomer Company, Inc.

To prepare a general purpose resin, CN964E75 was blended with CN965. To this mixture was added SR 494. To this SR1135 and TIN292 were added. The final weight % of each component is described above in the table.

EXAMPLE 2

A flexible resin was prepared with the following components, which are listed both as a % by volume and as a percent by weight:

| COMPONENT | % VOLUME | % BY WEIGHT |
|---|---|---|
| CN964E75 | 62.25 | 62.01 |
| SR344 | 34 | 34.43 |
| SR1135 | 1.75 | 1.76 |
| TIN292 | 2 | 1.80 |

In this regard, it should be noted that CN964E75, SR1135 and TIN292 are as described above under the general purpose resin. SR344 is a polyethylene glycol (400) diacrylate (100% by weight). TIN292 can be purchased from CIBA, Inc. All of the other components are sold by Sartomer Company, Inc.

To prepare a flexible resin, CN964E75 was blended with SR344. To this SR1135 and TIN292 were added. The final weight % of each component is described above in the table.

EXAMPLE 3

A tough and hard resin was prepared with the following components, which are listed both as a % by volume and as a percent by weight:

| COMPONENT | % VOLUME | % BY WEIGHT |
|---|---|---|
| CN964E75 | 57.25 | 56.61 |
| SR 494 | 10 | 10.15 |
| SR344 | 19 | 19.10 |
| CN968 | 10 | 10.61 |
| SR1135 | 1.75 | 1.76 |
| TIN292 | 2 | 1.78 |

In this regard, CN964E75, SR344, SR494, TIN292 and SR1135 are as described above. CN968 is an aliphatic urethane acrylate. In particular, CN968 includes an aliphatic urethane acrylate (30 to 40% by weight), acrylic esters (55 to 60% by weight) and acrylic esters (5 to 10% by weight).

To prepare a tough and hard resin, CN964E75 was blended with SR494, SR344 and CN968. To this SR1135 and TIN292 were added. The final weight % of each component is described above in the table.

EXAMPLE 4

A high heat resin was prepared with the following components, which are listed both as a % by volume and as a percent by weight:

| COMPONENT | % VOLUME | % BY WEIGHT |
|---|---|---|
| CN964E75 | 32.25 | 31.10 |
| SR 494 | 35 | 34.65 |
| CN965 | 13 | 12.55 |
| SR368 | 16 | 18.26 |
| SR1135 | 1.75 | 1.70 |
| TIN292 | 2 | 1.74 |

In this regard, CN964E75, CN965, SR494, SR1135 and TIN292 are as described above. SR368 is tris(2-hydroxy ethyl)isocyanurate triacrylate esters (100% by weight). TIN292 can be purchased from CIBA, Inc. All of the other components are sold by Sartomer Company, Inc.

To prepare a high heat resin, CN964E75 was blended with SR494 and CN965. To this SR368, SR1135 and TIN292 were added. The final weight % of each component is described above in the table.

EXAMPLE 5

Another general purpose resin was prepared as follows. The percent by volume of each component in the resin composition is set forth above in Table 1A. In order to prepare this resin, a cylindrical mixing tank (20 inches of diameter, 30 inches of length with baffles of 1.5 inches approximately) was used. The mixing tank included a high torque mixer that has attached an axial flow impeller. Using metal containers and a heating band, 9.0 L of CN964E75 and 3.6 L of CN965 were warmed to 35–40° F. and were then added to the mixing tank. Then 9.6 L of SR494 were added to the mixing tank and mixed for about 5 to 10 minutes or until homogenization of all components. 4.8 L of melted SR368 were then added to the mixing tank and agitation was continued for about 5–10 minutes or until homogenization was achieved. The mixture was then allowed to cool. Then 2.4 L of Tinuvin292 were added and mixing was continued for about 5 minutes. Darocur 4265 (600 mL) was then added to the mixing tank, and the mixture was agitated for about 10 minutes. The resultant resin was stored in dark containers and kept away from light. The resin turned from a white foamy consistency to a clear amber liquid about 24 hours after preparation.

EXAMPLE 6

A super-flex resin was prepared as follows. The percent by volume of each component in the resin composition is set forth above in Table 3A. Using metal containers and heating bands, 11.4 L of CN964E75, 4.5 L of CN966J75 and 4.5 L of CN965 were warmed to 35–40° F. These warmed ingredients were then added into the mixing tank, as described above. Then 6.9 L of SR344 and 2.1 L of Tinuvin292 were added to the mixing tank and stirred for about 5 to about 10 minutes or until homogenization of all components. Darocur 4265 (600 mL) was then added to the mixing tank and the mixture was agitated for about 10 minutes. The resin was stored in dark containers and kept away from light. The resin turned from a white foamy consistency to a clear amber liquid about 24 hours after preparation.

EXAMPLE 7

A mid-flex resin was prepared as follows. The percent by volume of each component in the resin composition is set forth above in Table 2A. Using metal containers and a heating band, 10.2 L of CN964E75 and 5.7 L of CN965 were warmed to 35–40° F. and were then added to the mixing tank, as described above. Then 8.1 L of SR494, 3.3 L of CN738 and 2.1 L of Tinuvin292 were added to the mixing tank and mixed for about 10 to about 20 minutes or until homogenization of all components. Darocur 4265 (600 mL) of was then added to the mixing tank, and the mixture was agitated for about 10 minutes. The resin was stored in dark containers and kept away from light. The resin turned from a white foamy consistency to a clear amber liquid about 24 hours after preparation.

EXAMPLE 8

A super high heat resin was prepared as follows. The percent by volume of each component in the resin composition is set forth above in Table 4. Using metal containers and a heating band, CN964E75 and CN965 were warmed to 35–40° F. and then added to the mixing tank, as described above. Then SR368 and SR506 were added to the mixing tank and agitation was continued for about 5–10 minutes or until homogenization was achieved. The mixture was then allowed to cool. Then, Darocur 4265 was added to the mixing tank and the mixture was agitated for about 10 minutes. The resin was stored in dark containers and kept away from light. The resin turned from a white foamy consistency to a clear amber liquid about 24 hours after preparation.

EXAMPLE 9

A tough resin was prepared as follows. The percent by volume of each component in the resin composition is set forth above in Table 5A. Using metal containers and the heating band, CN964E75 and CN963A80 were warmed to 35–40° F. and then added to the mixing tank, as described above. Then Tinuvin292 and SR506 were added and mixing was continued for about 5 to 10 minutes or until homogenization was achieved. Darocur 4265 was then added to the mixing tank and agitation of the mixture was continued for about 10 minutes. The resin was stored in dark containers and kept away from light. The resin turned from a white foamy consistency to a clear amber liquid about 24 hours after preparation.

EXAMPLE 10

Another super high heat resin was prepared as follows. Using metal containers and a heating band, 8.1 L of CN964E75 and 3.0 L of CN965 were warmed to 35–40° F. and were then added to the mixing tank, as described above. Then 12.0 L of SR368 were added to the mixing tank and mixed for about 5 to 10 minutes or until homogenization of all components. The mixture was allowed to cool and then 4.5 L of CD540 and 1.8 L of Tinuvin292 were added to the mixing tank and agitation was continued for about 5–10 minutes or until homogenization was achieved. Darocur 4265 (600 mL) was then and added to the mixing tank and agitation was continued for about 10 minutes. The resin was stored in dark containers and kept away from light. The resin turned from a white foamy consistency to a clear amber liquid about 24 hours after preparation.

EXAMPLE 11

Another tough resin was prepared as follows. Using metal containers and a heating band, 4.8 L of CN964E75 and 11.1 L of CN963A80 were warmed to 35–40° F. and then added to the mixing tank, as described above. Then 2.1 L of Tinuvin 292 and 11.1 L of SR506 were added to the mixing tank and mixed for about 5 to 10 minutes or until homogenization of all components is achieved. Then, 900 mL of Darocur 4265 were added to the mixing tank and agitation of the mixture was continued for about 10 minutes. The resin was stored in dark containers and kept away from light. The resin turned from a white foamy consistency to a clear amber liquid about 24 hours after preparation.

Tables 1–9 describe resins of various embodiments. Shrink ratios obtained for these resins (inch/inch) were 0.005 for the General Purpose, 0.003 for the Mid Flex, 0.004 for the Super Flex, 0.005 for the Super High Heat and 0.004 for the Impact Resistant (high impact) resins.

EXAMPLE 12

Stereolithographic resins based on acrylate-urethane oligomers show enhanced performance characteristics upon addition of exfoliated montmorillonite supplied by Southern Clay Co. (Gonzales, Tex,). Resins from various embodiments (Examples 1 to 5) were prepared by mixing together, in various concentrations, monomers, oligomers and photoinitiators. The resins when irradiated in 3D Systems stereolithographic machines produced parts suitable for numerous applications.

A series of nanoclays were introduced into various resin compositions in different concentrations varying from 0.25% to 10%.

In various embodiments, nanoclays were added to improve the physical and mechanical attributes of the resins in the cured resins. Good results were obtained by nanoclays designated as Cloisite N and Cloisite 20A.

| Parameter | Test | Average % increase in the presence of Cloisite N |
|---|---|---|
| Viscosity of the liquid resin (20 C) cps | Brookfield | Same |
| Tensile Modulus after post curing Mpa | ISO 527 | +12% |
| Tensile strength after post curing Mpa | ISO 527 | +11.5% |
| Elongation to break, % | ISO 527 | +3.0% |
| Impact after post curing KJ/m²(notched) | ISO 179 | +6.0% |
| Shore D hardness | | +4.0% |
| Glass transition DMA (E") | DMA 2/min. 1 Hz | +3.6 |

A number of embodiments have been described. Nevertheless, it will be understood that various modifications may be made without departing from the spirit and scope of the invention.

What is claimed is:

1. A liquid stereolithography resin comprising a first urethane acrylate oligomer, a first acrylate monomer, a polymerization modifier, a second urethane acrylate oligomer different from the first urethane acrylate oligomer, and a stabilizer; wherein the first urethane acrylate oligomer is an aliphatic polyester urethane diacrylate oligomer, wherein the first acrylate monomer is ethoxylated (3) trimethylolpropane acrylate, and the polymerization modifier is selected from the group consisting of isobornyl acrylate, ethoxylated (5) pentaerythritol tetraacrylate, an aliphatic urethane acrylate, tris-(2-hydroxyethyl)isocyanurate triacrylate, and mixtures thereof, wherein the resin includes 5–35 weight % an aliphatic polyester urethane diacrylate oligomer and 0.5–25 weight % ethoxylated (3) trimethylolpropane acrylate, wherein the resin includes 15–45 weight % ethoxylated (5) pentaerythritol tetraacrylate.

2. The liquid stereolithography resin of claim 1, wherein the resin includes 5–35 weight % tris-(2-hydroxyethyl)isocyanurate triacrylate.

3. The liquid stereolithography resin of claim 1, wherein the resin includes 5–35 weight % isobornyl acrylate.

4. The liquid stereolithography resin of claim 1, wherein the resin includes 10–35 weight % an aliphatic polyester urethane diacrylate and 0.5–25 weight % isobornyl acrylate.

5. The liquid stereolithography resin of claim 1, wherein the resin includes 6–35 weight % isobornyl acrylate.

6. The liquid stereolithography resin of claim 1, wherein the resin includes 50–80 weight % an aliphatic urethane containing bound silicone and 0.5–20 weight % isobornyl acrylate.

7. The liquid stereolithography resin of claim 1, wherein the resin includes 45–75 weight % an aromatic urethane acrylate oligomer and 10–70 weight % isobornyl acrylate.

8. The liquid stereolithography resin of claim 1, wherein the resin includes 10–40 weight % isobornyl acrylate.

9. The liquid stereolithography resin of claim 1, further comprising a photoinitiator.

10. The liquid stereolithography resin of claim 9, wherein the photoinitiator includes a phosphine oxide, an alpha-hydroxyketone, and a benzophenone derivative.

11. The liquid stereolithography resin of claim 9, wherein the photoinitiator includes a component selected from the group consisting of a benzophenone, a benzil dimethyl ketal, a 1-hydroxy-cyclohexylphenylketone, an isopropyl thioxanthone, an ethyl 4-(dimethylamino)benzoate, a blend of 2,4,6-trimethylbenzoyldiphenyl phosphine oxide, 2,4,6-trimethylbenzophenone, 4-methylbenzophenone, and oligo(2-hydroxy-2-methyl-1-(4-(1-methylvinyl)phenyl)propanone, a benzoin normal butyl ether, a blend of oligo(2-hydroxy-2-methyl-1-(4-(1-methylvinyl)phenyl)propanone) and poly(2-hydroxy-2-methyl-1-phenyl-1-propanone), tripropyleneglycol diacrylate, an oligo(2-hydroxy-2-methyl-1-(4-(1-methylvinyl)phenyl)propanone), a 2-hydroxy-2-methyl-1-phenyl-1-propanone, a poly(2-hydroxy-2-methyl-1-phenyl-1-propanone), a trimethylolpropane triacrylate, a mixture of 2,4,6-trimethylbenzophenone and 4-methylbenzophenone, a phosphine oxide, a 4-methylbenzophenone, a trimethylbenzophenone, a methylbenzophenone, and a blend of 2,4,6-trimethylbenzoyl-diphenyl-phosphineoxide and hydroxy-2-methyl-1-phenyl-propan-1-one.

12. The liquid stereolithography resin of claim 9, wherein the photoinitiator includes a component selected from the group consisting of 2,4,6-trimethylbenzoyl-diphenyl-phosphineoxide and hydroxy-2-methyl-1-phenyl-propan-1-one, a phosphine oxide, and a 2-hydroxy-2-methyl-1-phenyl-1-propanone, or mixtures thereof.

13. The liquid stereolithography resin of claim 9, wherein the photoinitiator activates polymerization of an acrylate in a wavelength range of 240 nm to 250 nm, 360 nm to 380 nm, or 390 nm to 410 nm.

14. The liquid stereolithography resin of claim 1, wherein the stabilizer is selected from the group consisting of (bis(1,2,2,6,6-pentamethyl-4-piperidyl)sebacate and 1-methyl-10-(1,2,2,6,6-pentamethyl-4-piperidyl)sebacate), (bis(1,2,2,6,6-pentamethyl-4-piperidyl)sebacate), MEQH (4-methoxyphenol), 2-(2'-hydroxy-5'-methylphenyl)benzotriazole, 1,2,2,6,6-pentamethyl-4-piperidyl methacrylate and (2-hydroxy-4-octyloxybenzophenone).

15. A liquid stereolithography resin comprising a first urethane acrylate oligomer, a first acrylate monomer, a polymerization modifier, a second urethane acrylate oligomer different from the first urethane acrylate oligomer, and a stabilizer; wherein the first urethane acrylate oligomer is an aliphatic polyester urethane diacrylate oligomer, wherein the first acrylate monomer is ethoxylated (3) trimethylolpropane acrylate, and the polymerization modifier is selected from the group consisting of isobornyl acrylate, ethoxylated (5) pentaerythritol tetraacrylate, an aliphatic urethane acrylate, tris-(2-hydroxyethyl)isocyanurate triacrylate, and mixtures thereof, wherein the resin includes 5–35 weight % an aliphatic polyester urethane diacrylate oligomer and 0.5–25 weight % ethoxylated (3) trimethylolpropane acrylate, wherein the resin includes 0.5–25 weight % an aliphatic urethane acrylate.

16. The liquid stereolithography resin of claim 15, wherein the resin includes 5–35 weight % tris-(2-hydroxyethyl)isocyanurate triacrylate.

17. The liquid stereolithography resin of claim 15, wherein the resin includes 5–35 weight % isobornyl acrylate.

18. The liquid stereolithography resin of claim 15, wherein the resin includes 10–35 weight % an aliphatic polyester urethane diacrylate and 0.5–25 weight % isobornyl acrylate.

19. The liquid stereolithography resin of claim 15, wherein the resin includes 6 . 35 weight % isobornyl acrylate.

20. The liquid stereolithography resin of claim 15, wherein the resin includes 50 . 80 weight % an aliphatic urethane containing bound silicone and 0.5–20 weight % isobornyl acrylate.

21. The liquid stereolithography resin of claim 15, wherein the resin includes 45–75 weight % an aromatic urethane acrylate oligomer and 10–70 weight % isobornyl acrylate.

22. The liquid stereolithography resin of claim 15, wherein the resin includes 10–40 weight % isobornyl acrylate.

23. The liquid stereolithography resin of claim 15, further comprising a photoinitiator.

24. The liquid stereolithography resin of claim 23, wherein the photoinitiator includes a phosphine oxide, an alpha-hydroxyketone, and a benzophenone derivative.

25. The liquid stereolithography resin of claim 23, wherein the photoinitiator includes a component selected from the group consisting of a benzophenone, a benzil dimethyl ketal, a 1-hydroxy-cyclohexylphenylketone, an isopropyl thioxanthone, an ethyl 4-(dimethylamino)benzoate, a blend of 2,4,6-trimethylbenzoyldiphenyl phosphine oxide, 2,4,6-trimethylbenzophenone, 4-methylbenzophenone, and oligo(2-hydroxy-2-methyl-1-(4-(1-methylvinyl)phenyl)propanone, a benzoin normal butyl ether, a blend of oligo(2-hydroxy-2-methyl-1-(4-(1-methylvinyl)phenyl)propanone) and poly(2-hydroxy-2-methyl-1-phenyl-1-propanone), tripropyleneglycol diacrylate, an oligo(2-hydroxy-2-methyl-1-(4-(1-methylvinyl)phenyl)propanone), a 2-hydroxy-2-methyl-1-phenyl-1-propanone, a poly(2-hydroxy-2-methyl-1-phenyl-1-propanone), a trimethyloipropane triacrylate, a mixture of 2,4,6-trimethylbenzophenone and 4-methylbenzophenone, a phosphine oxide, a 4-methylbenzophenone, a trimethylbenzophenone, a methylbenzophenone, and a blend of 2,4,6-trimethylbenzoyl-diphenyl-phosphineoxide and hydroxy-2-methyl-1-phenyl-propan-1-one.

26. The liquid stereolithography resin of claim 23, wherein the photoinitiator includes a component selected from the group consisting of 2,4,6-trimethylbenzoyl-diphenyl-phosphineoxide and hydroxy-2-methyl-1-phenyl-propan-1-one, a phosphine oxide, and a 2-hydroxy-2-methyl-1-phenyl-1-propanone, or mixtures thereof.

27. The liquid stereolithography resin of claim 23, wherein the photoinitiator activates polymerization of an acrylate in a wavelength range of 240 nm to 250 nm, 360 nm to 380 nm, or 390 nm to 410 nm.

28. The liquid stereolithography resin of claim 15, wherein the stabilizer is selected from the group consisting of (bis(1,2,2,6,6-pentamethyl-4-piperidyl)sebacate and 1-methyl-10-(1,2,2,6,6-pentamethyl-4-piperidyl)sebacate), (bis(1,2,2,6,6-pentamethyl-4-piperidyl)sebacate), MEQH (4-methoxyphenol), 2-(2'-hydroxy-5'-methylphenyl)benzotriazole, 1,2,2,6,6-pentamethyl-4-piperidyl methacrylate and (2-hydroxy-4-octyloxybenzophenone).

29. A liquid stereolithography resin comprising an aliphatic polyester urethane diacrylate oligomer, an ethoxylated (3) trimethylolpropane acrylate, and a polymerization modifier comprising a member selected from the group consisting of isobornyl acrylate, ethoxylated (5) pentaerythritol tetraacrylate, an aliphatic urethane acrylate, tris-(2-hydroxyethyl)isocyanurate triacrylate, and mixtures thereof, wherein the resin includes 15–45 weight % ethoxylated (5) pentaerythritol tetraacrylate.

30. A liquid stereolithography resin comprising an aliphatic polyester urethane diacrylate oligomer, an ethoxylated (3) trimethylolpropane acrylate, and a polymerization modifier comprising a member selected from the group consisting of isobornyl acrylate, ethoxylated (5) pentaerythritol tetraacrylate, an aliphatic urethane acrylate, tris-(2-hydroxyethyl)isocyanurate triacrylate, and mixtures thereof, wherein the resin includes 0.5–25 weight % an aliphatic urethane acrylate.

* * * * *